US009991152B2

(12) United States Patent
Ingram-Goble et al.

(10) Patent No.: US 9,991,152 B2
(45) Date of Patent: Jun. 5, 2018

(54) WAFER-HANDLING END EFFECTORS WITH WAFER-CONTACTING SURFACES AND SEALING STRUCTURES

(71) Applicant: CASCADE MICROTECH, INC., Beaverton, OR (US)

(72) Inventors: Robbie Ingram-Goble, Portland, OR (US); Michael E. Simmons, Colton, OR (US); Philip Wolf, Beaverton, OR (US); Ryan Garrison, Beaverton, OR (US); Christopher Storm, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 58 days.

(21) Appl. No.: 14/631,131

(22) Filed: Feb. 25, 2015

(65) Prior Publication Data

US 2015/0255322 A1 Sep. 10, 2015

Related U.S. Application Data

(60) Provisional application No. 61/949,096, filed on Mar. 6, 2014.

(51) Int. Cl.

*H01L 21/683* (2006.01)
*B25J 15/06* (2006.01)

(Continued)

(52) U.S. Cl.

CPC ....... *H01L 21/6838* (2013.01); *B25J 11/0095* (2013.01); *B25J 15/0014* (2013.01);

(Continued)

(58) Field of Classification Search

CPC ................ B25J 15/0683; B25J 15/0014; B25J 15/0616; H01L 21/6838

See application file for complete search history.

(56) References Cited

U.S. PATENT DOCUMENTS 3,154,306 A * 10/1964 Elliott .................. B65H 3/0883 294/189
3,230,002 A * 1/1966 Olson .................... B65G 47/91 294/188

(Continued)

FOREIGN PATENT DOCUMENTS

JP H08107136 A 4/1996
JP 2002346965 A 12/2002

(Continued)

OTHER PUBLICATIONS

English-language abstract of Taiwan Patent Application No. TW200908195, Feb. 16, 2009.

(Continued)

*Primary Examiner* — Gerald McClain
(74) *Attorney, Agent, or Firm* — Dascenzo Intellectual Property Law, P.C.

(57) ABSTRACT

Wafer-handling end effectors and semiconductor manufacturing devices that include and/or are utilized with wafer-handling end effectors are disclosed herein. The end effectors include an end effector body and a plurality of wafer-contacting surfaces that is supported by the end effector body and configured to form an at least partially face-to-face contact with a wafer. The end effectors further include a vacuum distribution manifold that extends between a robot-proximal end of the end effector body and the plurality of wafer-contacting surfaces. The end effectors also include a plurality of vacuum openings that is defined within the plurality of wafer-contacting surfaces and extends between the plurality of wafer-contacting surfaces and the vacuum distribution manifold. The end effectors further include a plurality of sealing structures each of which is associated with a respective one of the plurality of wafer-contacting surfaces.

22 Claims, 5 Drawing Sheets

20
100
130
136
134
122
190
120
50
110
138
137
118
180
139

(51) Int. Cl.
*B25J 11/00* (2006.01)
*B25J 15/00* (2006.01)
*H01L 21/677* (2006.01)

(52) U.S. Cl.
CPC .... *B25J 15/0616* (2013.01); *H01L 21/67778* (2013.01); *Y10S 901/40* (2013.01)

(56) References Cited

U.S. PATENT DOCUMENTS

| | | | |
|---|---|---|---|
| 4,600,229 A * | 7/1986 | Oten | B65G 47/91 294/189 |
| 4,708,381 A * | 11/1987 | Lundback | B65G 47/91 248/362 |
| 4,852,926 A * | 8/1989 | Littell | B25J 15/0616 294/189 |
| 5,013,075 A * | 5/1991 | Littell | B25J 15/0616 294/189 |
| 5,226,636 A * | 7/1993 | Nenadic | B25B 11/005 269/21 |
| 6,256,555 B1 | 7/2001 | Bacchi et al. | |
| 6,279,976 B1 | 8/2001 | Ball | |
| 6,409,453 B1 | 6/2002 | Brodine et al. | |
| 6,499,777 B1 | 12/2002 | Wang | |
| 6,690,986 B1 | 2/2004 | Mitchell et al. | |
| 6,739,638 B1 * | 5/2004 | Yazawa | B25J 15/0616 414/752.1 |
| 6,942,265 B1 | 9/2005 | Boyd et al. | |
| 7,293,811 B2 | 11/2007 | Bbnora et al. | |
| 8,281,674 B2 | 10/2012 | Nisany et al. | |
| 9,460,953 B2 * | 10/2016 | Sato | B25J 15/0014 |
| 9,829,802 B2 * | 11/2017 | Matsuhira | H01L 21/6838 |
| 2003/0006010 A1 | 1/2003 | Holzbecher et al. | |
| 2012/0235335 A1 | 9/2012 | Hayashi et al. | |

FOREIGN PATENT DOCUMENTS

| | | |
|---|---|---|
| JP | 2009158902 A * | 7/2009 |
| TW | 200908195 | 2/2009 |
| TW | 201034108 | 9/2010 |

OTHER PUBLICATIONS

English-language abstract of Taiwan Patent Application No. TW201034108, Sep. 16, 2010.

PowerPoint Presentation by Owens Design entitled End Effector Selection and Design, accessed Feb. 20, 2014.

English-language translation of Japanese Patent Publication 2009-158902 A, Jul. 16, 2009.

English-language translation of Japanese Patent Publication JPH08107136 A, Apr. 23, 1996.

English-language translation of Japanese Patent Publication JP2002346965A, Dec. 4, 2002.

English-language abstract of Japanese Patent Publication JPH08107136 A, Apr. 23, 1996.

English-language abstract of Japanese Patent Publication JP2002346965A, Dec. 4, 2002.

* cited by examiner

WAFER-HANDLING END EFFECTORS WITH WAFER-CONTACTING SURFACES AND SEALING STRUCTURES

RELATED APPLICATION

This application claims priority to U.S. Provisional Patent Application No. 61/949,096, which was filed on Mar. 6, 2014, and the complete disclosure of which is hereby incorporated by reference.

FIELD OF THE DISCLOSURE

The present disclosure is directed generally to wafer-handling end effectors and more particularly to wafer-handling end effectors that form a plurality of surface contacts with a wafer and utilize a vacuum to retain the wafer on the end effector.

BACKGROUND OF THE DISCLOSURE

During processing and/or testing of electronic devices, wafers often are transferred from one manufacturing device to another manufacturing device, such as in wafer cassettes. These wafer cassettes protect the wafers during transit and generally are configured to contain a plurality of wafers, with each wafer being located in a respective wafer slot within the cassette.

To complete a manufacturing operation on a given wafer, the wafer may be removed from the cassette and located within a manufacturing device. The wafer also may be moved from one location to another location within the manufacturing device. Wafer-handling end effectors may be utilized to remove the wafer from the cassette and/or to move the wafer within the manufacturing device. Historically, these end effectors are configured to contact a back, or bottom, side of the wafer, and the wafer is retained on the end effector via gravity and/or via a vacuum force.

As wafers become thinner, such as may be the case for wafers that are utilized during the manufacture of vertically oriented electronic devices (i.e., electronic devices that extend between a front side of the wafer and the back side of the wafer), the wafers may bow or otherwise deform or deflect to a non-planar orientation. This bowing may be the result of the gravitational force on the wafer and/or internal stresses within the wafer. To further complicate matters, this bowing may result in the wafer having a concave configuration, a convex configuration, a hyperbolic paraboloid configuration, or a mixture of concave regions and convex regions. Thin, bowed wafers present unique handling challenges, both in how to form a vacuum seal with the back side of the bowed wafer and in how to transfer the wafer without damage thereto. Thus, there exists a need for improved wafer-handling end effectors.

SUMMARY OF THE DISCLOSURE

Wafer-handling end effectors and semiconductor manufacturing devices that include and/or are utilized with wafer-handling end effectors are disclosed herein. The end effectors include an end effector body and a plurality of wafer-contacting surfaces. The wafer-contacting surfaces are supported by the end effector body and configured to form an at least partially face-to-face contact with a wafer. The end effectors further include a vacuum distribution manifold that extends between a robot-proximal end of the end effector body and the plurality of wafer-contacting surfaces.

The end effectors also include a plurality of vacuum openings defined within the plurality of wafer-contacting surfaces. The plurality of vacuum openings extends between the plurality of wafer-contacting surfaces and the vacuum distribution manifold. The end effectors further include a plurality of sealing structures, each of which is associated with a respective one of the plurality of wafer-contacting surfaces.

In some embodiments, each of the plurality of wafer-contacting surfaces defines a wafer-contacting surface area of at least 1 square millimeter. In some embodiments, each of the plurality of wafer-contacting surfaces is at least substantially rigid. In some embodiments, each of the plurality of wafer-contacting surfaces is at least substantially planar. In some embodiments, each of the sealing structures extends around the respective one of the plurality of wafer-contacting surfaces.

DETAILED DESCRIPTION AND BEST MODE OF THE DISCLOSURE

Figure 1:
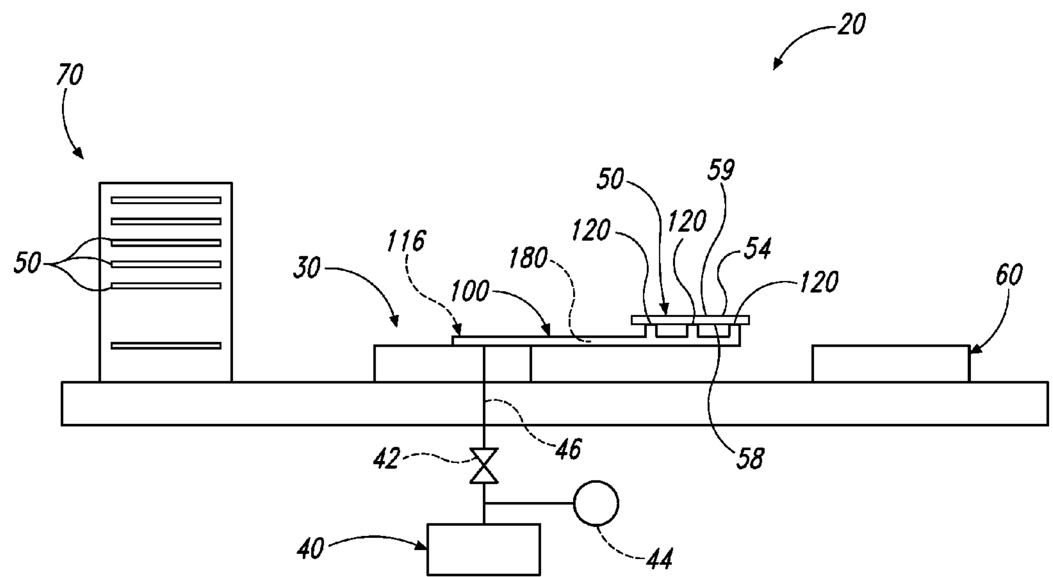
FIG. 1 is a schematic representation of examples of a semiconductor manufacturing device that may utilize an end effector according to the present disclosure.

FIGS. 1-13 provide examples of wafer-handling end effectors 100, of semiconductor manufacturing devices 20 that include the wafer-handling end effectors, and/or of components and/or features of wafer-handling end effectors 100 according to the present disclosure. Elements that serve a similar, or at least substantially similar, purpose are labeled with like numbers in each of FIGS. 1-13, and these elements may not be discussed in detail herein with reference to each of FIGS. 1-13. Similarly, all elements may not be labeled in each of FIGS. 1-13, but reference numerals associated therewith may be utilized herein for consistency. Elements, components, and/or features that are discussed herein with reference to one or more of FIGS. 1-13 may be included in and/or utilized with any of FIGS. 1-13 without departing from the scope of the present disclosure.

In general, elements that are likely to be included in a given (i.e., a particular) embodiment are illustrated in solid lines, while elements that are optional to a given embodiment are illustrated in dashed lines. However, elements that are shown in solid lines are not essential to all embodiments, and an element shown in solid lines may be omitted from a particular embodiment without departing from the scope of the present disclosure.

FIG. 1 is a schematic representation of examples of a semiconductor manufacturing device 20 that may utilize a wafer-handling end effector 100 according to the present disclosure. Device 20 includes a transfer robot 30 that includes and/or is operatively attached to wafer-handling end effector 100. Transfer robot 30 additionally or alternatively may be referred to herein as a wafer transfer device 30 and/or as a wafer positioning device 30. Wafer handling end effector 100 also may be referred to herein as an end effector 100. End effector 100 may be utilized to transfer wafers 50 within device 20 and/or between a wafer cassette 70 and one or more components that may be internal to device 20, such as a wafer chuck 60. Device 20 further includes and/or is in fluid communication with a vacuum source 40 that is configured to apply a vacuum to a vacuum distribution manifold 180 of end effector 100 to retain the wafer thereon, as discussed in more detail herein. This may include applying the vacuum between the end effector and a back side 58 of wafer 50. Back side 58 may include any suitable side of wafer 50 that contacts end effector 100, that is retained on end effector 100, and/or that experiences the vacuum that is applied by vacuum distribution manifold 180. As an example, back side 58 may include and/or be a bottom, lower, and/or under side of wafer 50. As another example, back side 58 may be opposed to a front, upper, and/or top side 59 of wafer 50, such as a side of wafer 50 that has electronic devices 54 formed thereon.

As illustrated in dashed lines in FIG. 1, semiconductor manufacturing device 20 further may include a valve 42 and a pressure gauge 44. Valve 42 may be configured to selectively and fluidly isolate vacuum source 40 from vacuum distribution manifold 180 of end effector 100. Pressure gauge 44 may be configured to measure a pressure within a vacuum line 46 that extends between vacuum source 40 and vacuum distribution manifold 180. As illustrated, this pressure may be measured between vacuum source 40 and valve 42, when present; however, this is not required. Additionally or alternatively, one or both of the valve 42 and the pressure gauge 44 may be described as being part of the vacuum source 40.

As discussed in more detail herein, end effector 100 may be adapted, configured, designed, sized, and/or constructed to retain and/or transfer wafers 50 that include and/or define a variety of different thicknesses, diameters, materials of construction, and/or shapes. As examples, end effector 100 may be configured to retain and/or transfer warped, bent, and/or otherwise nonplanar wafers 50.

During operation of device 20, a pressure that is detected by pressure gauge 44 may be utilized to determine whether, or to what extent, wafer 50 is being retained by end effector 100. As an example, and as discussed in more detail herein, end effector 100 may be configured to draw wafer 50 into contact with a plurality of wafer-contacting surfaces 120 that are defined by the end effector. Under these conditions, the level of vacuum that is detected by pressure gauge 44 may indicate a degree to which the wafer is drawn into contact with the wafer-contacting surfaces.

As a more specific example, the pressure detected by pressure gauge 44 may be relatively and/or comparatively higher (i.e., the vacuum in vacuum line 46 may be lower) when the wafer is not drawn into contact with wafer-contacting surfaces 120, is not drawn into contact with all wafer-contacting surfaces 120, and/or is not drawn into direct face-to-fact contact with wafer-contacting surfaces 120. As another more specific example, the pressure detected by pressure gauge 44 may be relatively and/or comparatively lower when the wafer is drawn into contact with wafer-contacting surfaces 120, is drawn into contact with all wafer-contacting surfaces 120, and/or is drawn into direct face-to-face contact with wafer-contacting surfaces 120. Valve 42 may be utilized to provide a comparison point for determining whether wafer 50 is being retained by end effector 100. As an example, the pressure detected by pressure gauge 44 when valve 42 is closed may provide a reference point for the relatively lower pressure that is discussed above.

It is within the scope of the present disclosure that device 20 may include and/or be any suitable semiconductor manufacturing device. For example, device 20 may include and/or be a test system, a probe system, an engineering system, a high volume manufacturing system, and/or a wafer processing system. As another example, device 20 may include any suitable device that may be adapted, configured, designed, and/or constructed to modify wafer 50, to test and/or quantify a performance of one or more electronic devices 54 that may be present and/or defined on wafer 50, to clean wafer 50, and/or to form at least a portion of devices 54.

Figure 2:
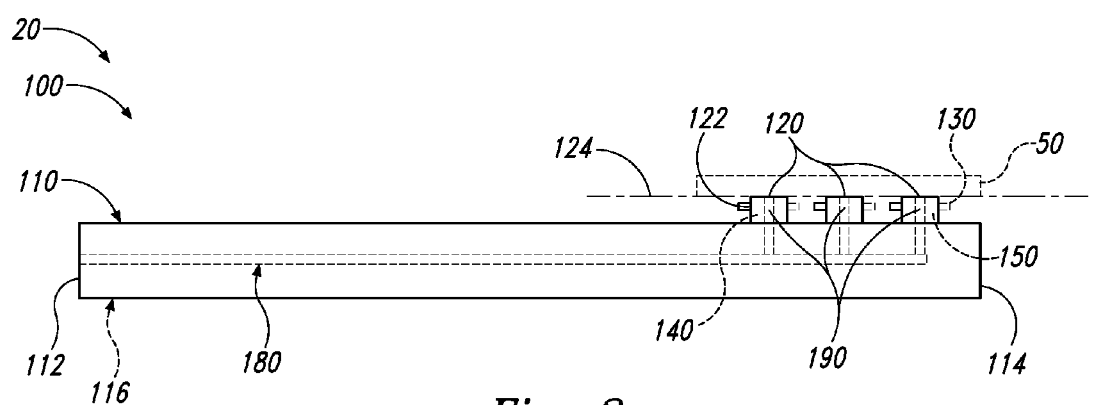
FIG. 2 is a schematic side view of examples of an end effector according to the present disclosure.

FIG. 2 is a schematic side view of examples of an end effector 100, according to the present disclosure, which may be included in and/or utilized with a semiconductor manufacturing device 20, such as device 20 of FIG. 1. End effector 100 includes an end effector body 110 that extends between and/or defines a robot-proximal end 112 and a robot-distal end 114. The end effector further includes and/or defines a plurality of spaced-apart wafer-contacting surfaces 120 that are configured to support a wafer 50. Wafer-contacting surfaces 120 additionally or alternatively may be referred to as sealing surfaces 120 and/or sealing regions 120. The end effector also includes and/or defines a vacuum distribution manifold 180 and a plurality of vacuum openings 190. The vacuum openings are defined within wafer-contacting surfaces 120 and extend between wafer-contacting surfaces 120 and vacuum distribution manifold 180.

End effector 100 is adapted, configured, designed, sized, and/or constructed to form an at least partial vacuum seal with wafer 50. This may be accomplished by applying a vacuum to an interface between wafer 50 and wafer-contacting surfaces 120 via vacuum distribution manifold 180 and vacuum openings 190. Application of the vacuum generates a vacuum force that retains wafer 50 operatively affixed to end effector 100 during movement of the wafer by the end effector. As illustrated in dashed lines in FIG. 2 and discussed in more detail herein, end effectors 100 further may include a plurality of sealing structures 130 and/or one or more surface alignment structures 150, each of which may aid in the formation of the vacuum seal, may increase an integrity of the vacuum seal, and/or may increase a pressure drop that may be obtained and/or maintained across the vacuum seal.

Figure 3:
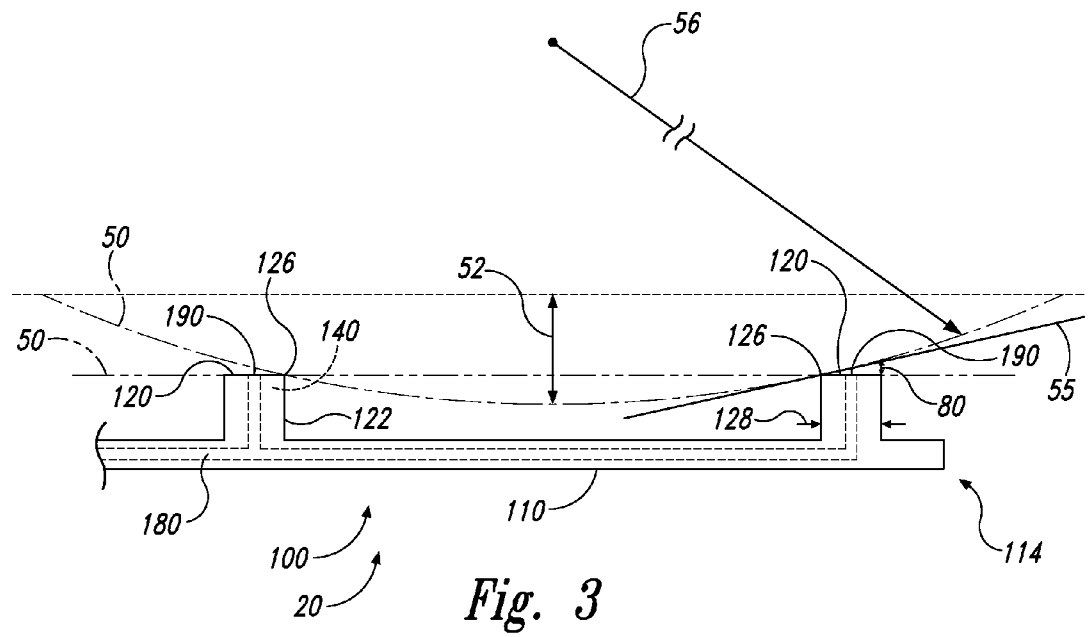
FIG. 3 is a schematic cross-sectional view of a portion of an end effector according to the present disclosure illustrating vacuum attachment of the end effector to a convex side of a bowed wafer.
Figure 4:
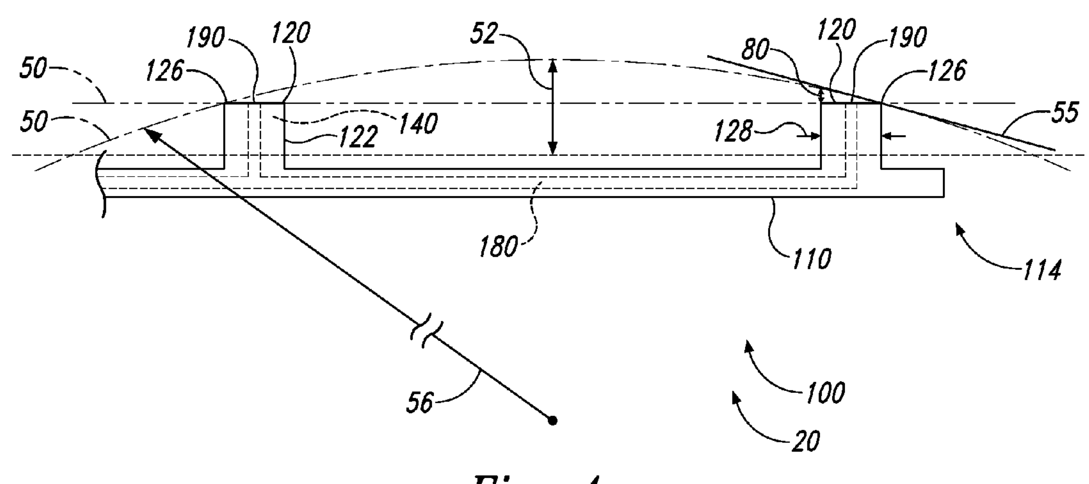
FIG. 4 is another schematic cross-sectional view of a portion of an end effector according to the present disclosure illustrating vacuum attachment of the end effector to a concave side of a bowed wafer.

End effectors 100 according to the present disclosure may be specifically sized, designed, and/or constructed to permit formation of the vacuum seal with wafers 50 that may be bowed, warped, deformed, and/or otherwise nonplanar. For example, and as illustrated in FIGS. 3-4, end effectors 100 may be configured to form the vacuum seal with wafers 50 that are bowed by up to a threshold bow depth 52. This may include forming the vacuum seal with wafers 50 that are concave up and/or that contact the end effector with a convex side thereof, as illustrated in dash-dot lines in FIG. 3 and/or forming the vacuum seal with wafers 50 that are concave down and/or that contact the end effector with a concave side thereof, as illustrated in dash-dot lines in FIG. 4. End effectors 100 also may be configured to form the vacuum seal with wafers having more complex bowed, or non-planar, configurations.

Regardless of the relative orientation of the wafer non-planarity relative to end effector 100, the end effector may be configured to draw at least a portion of wafer 50 into contact, which may be sealing contact, with wafer-contacting surfaces 120 upon application of the vacuum to vacuum openings 190. This is illustrated in dash-dot-dot lines in FIGS. 3-4. FIGS. 3-4 illustrate the wafer being drawn into a planar, or at least substantially planar, conformation upon being drawn into contact with wafer-contacting surfaces 120. However, such a conformation is not required as long as the wafer is drawn into contact with the wafer-contacting surfaces and/or forms the vacuum seal with the wafer-contacting surfaces.

A size and/or configuration of end effector 100 may be selected specifically to permit the end effector to draw the wafer into contact with the wafer-contacting surfaces and/or to form the vacuum seals. For example, and prior to application of the vacuum, the wafer may not be in contact with wafer-contacting surfaces 120 and instead may be in contact with only a wafer-contacting edge, or edge region, 126 thereof. Application of the vacuum may generate a flow of air into vacuum openings 190, which may decrease the pressure within an air gap 80 between the wafer and the wafer-contacting surface. If the air gap is small enough, this pressure decrease will be sufficient to draw the wafer into contact with the wafer-contacting surface. However, if the air gap is too large, the pressure drop therein will be insufficient to draw the wafer into contact with the wafer-contacting surface.

With this in mind, a width 128 of wafer-contacting surfaces 120 may be selected such that air gap 80 is sufficiently small to permit the wafer to be drawn into contact with the wafer-contacting surface upon application of the vacuum. As an example, width 128 may be selected to maintain gap 80 below a threshold air gap length and may be based, at least in part, upon a slope of a tangent line 55 to wafer 50 at a point where wafer 50 contacts wafer-contacting surfaces 120. For wafers with a small bow depth 52 and end effectors with a small width 128, air gap 80 may be approximated as width 128 multiplied by the slope of tangent line 55. Thus, for a given slope of tangent line 55 (such as may be determined from an expected conformation of wafers 50 that are expected to be transferred by end effector 100), width 128 may be selected to maintain an expected gap 80 below the threshold air gap length. Examples of the threshold air gap length are disclosed herein. In the case of a substantially flat wafer and/or wafers with a large radius of curvature 56, gap 80 will be approximately zero. Under these conditions, width 128 may not be constrained by the magnitude of gap 80.

Examples of width 128 include widths of at least 0.4 millimeters (mm), at least 0.5 mm, at least 0.6 mm, at least 0.7 mm, at least 0.8 mm, at least 0.9 mm, at least 1 mm, at least 2 mm, at least 3 mm, at least 4 mm, at least 5 mm, at least 6 mm, at least 7 mm, at least 8 mm, at least 9 mm, at least 10 mm, at least 12 mm, or at least 14 mm. Additionally or alternatively, width 128 also may be less than 20 mm, less than 18 mm, less than 16 mm, less than 14 mm, less than 12 mm, less than 10 mm, less than 8 mm, less than 6 mm, or less than 4 mm.

As wafers 50 may have complex curvatures and/or regions of curvature, the radius of curvature and/or the slope of the tangent line may not be the same at, or proximate, each wafer-contacting surface 120. As an example, a cross-section of the wafer may be parabolic, or at least substantially parabolic, in shape. As another example, a surface of the wafer may define, or at least substantially define, a hyperbolic paraboloid. Should this be the case, then the preceding examples may be considered in the context of the radius of curvature and/or the slope of the tangent line at, or proximate, where the wafer contacts a particular wafer-contacting surface 120.

In addition, radius of curvature 56 may be an actual radius of curvature of an actual wafer 50 and/or an "expected" and/or "designed" radius of curvature. As an example, the width of wafer-contacting surfaces 120 may be selected such that air gap 80 is sufficiently small to permit a wafer 50 with greater than the expected and/or designed radius of curvature to be drawn into contact with the wafer-contacting surfaces upon application of the vacuum.

End effector 100 also may be configured such that air gap 80 is less than a threshold air gap length. For example, the end effector may be configured such that the air gap is less than 5 millimeters, less than 4 millimeters, less than 3 millimeters, less than 2 millimeters, less than 1 millimeters, less than 800 micrometers, less than 600 micrometers, less than 400 micrometers, less than 200 micrometers, less than 150 micrometers, less than 100 micrometers, less than 75 micrometers, less than 50 micrometers, less than 40 micrometers, less than 30 micrometers, less than 20 micrometers, or less than 10 micrometers.

Furthermore, and when end effector 100 is configured to form the vacuum seal with both concave up wafers (as illustrated in FIG. 3) and concave down wafers (as illustrated in FIG. 4), vacuum openings 190 may be at least substantially centered on the wafer-contacting surfaces and/or on width 128. As discussed in more detail herein, width 128 also may be referred to herein as a radial extent 128 of wafer-contacting surfaces 120.

End effectors 100 also may be specifically sized, designed, and/or constructed to form the vacuum seal without permanent deformation of and/or without significant and/or measurable damage to wafers 50 in the vicinity of wafer-contacting surfaces 120. For example, wafer-contacting surfaces 120 may be at least substantially rigid and/or may be formed from an at least substantially rigid material. This may permit the wafer-contacting surfaces to support the wafer and resist deformation during formation of the vacuum seal. As a more specific example, wafer-contacting surfaces 120 may have and/or define a Brinell hardness of at least 1 HB, at least 5 HB, at least 10 HB, at least 15 HB, at least 20 HB, at least 40 HB, at least 60 HB, at least 80 HB, at least 100 HB, at least 200 HB, at least 300 HB, at least 400 HB, at least 500 HB, at least 600 HB, at least 700 HB, at least 800 HB, at least 900 HB, or at least 1000 HB.

As another example, wafer-contacting surfaces 120 may be planar, or at least substantially planar, wafer-contacting surfaces 120. This may permit the wafer-contacting surfaces to form a face-to-face contact with the wafer over a substantial portion, or even all, of a surface area of the wafer-contacting surfaces.

As yet another example, a relative orientation of the wafer-contacting surfaces (relative to each other and/or relative to body 110 of end effector 100) may be at least substantially fixed. This may permit the end effector to form the vacuum seal with the wafer without motion and/or deformation of the end effector, which (in turn) may cause buckling and/or deformation of the wafer.

As another example, and as illustrated in dash-dot lines in FIG. 2, the wafer-contacting surfaces may define a wafer contact plane 124, the wafer-contacting surfaces may be coplanar with one another, and/or each of the wafer-contacting surfaces may be coplanar with the other wafer-contacting surfaces to within a threshold tolerance. This may permit the end effector to form the vacuum seal with the wafer within a defined plane, such as wafer contact plane 124, thereby regulating deformation of the wafer during formation of the vacuum seal. As examples, the threshold tolerance may be less than 5 millimeters, less than 4 millimeters, less than 3 millimeters, less than 2 millimeters, less than 1 millimeters, less than 800 micrometers, less than 600 micrometers, less than 400 micrometers, less than 200 micrometers, less than 150 micrometers, less than 100 micrometers, less than 75 micrometers, less than 50 micrometers, less than 25 micrometers, and/or less than 10 micrometers. This threshold tolerance may, but is not required to, correspond to air gap 80 (as illustrated in FIGS. 3-4) between at least one of the wafer-contacting surfaces and the corresponding region of the wafer. Additionally or alternatively, the threshold tolerance also may be less than a threshold fraction of a thickness of wafer 50. For example, the threshold fraction may be less than 100%, less than 75%, less than 50%, less than 40%, less than 30%, less than 20%, less than 10%, and/or less than 5% of the thickness of the wafer.

As yet another example, a cross-sectional diameter of each vacuum opening 190 may be selected to be less than a threshold percentage of the thickness of wafer 50. This may decrease a potential for a portion the wafer to be drawn, bowed, and/or deformed into one or more of the vacuum openings 190 during application of the vacuum and/or formation of the vacuum seal. For example, the threshold percentage may be less than 2000%, less than 1800%, less than 1600%, less than 1400%, less than 1200%, less than 1000%, less than 800%, less than 700%, less than 600%, less than 500%, less than 400%, less than 300%, less than 200%, less than 100%, less than 75%, or less than 50% of the thickness of the wafer. As another example, the diameter or other cross-sectional dimension of each vacuum opening may be less than 2 millimeters (mm), less than 1.75 mm, less than 1.5 mm, less than 1.25 mm, less than 1 mm, less than 0.9 mm, less than 0.8 mm, less than 0.7 mm, less than 0.6 mm, less than 0.5 mm, less than 0.4 mm, less than 0.3 mm, less than 0.2 mm, less than 0.1 mm, less than 0.05 mm, less than 0.025 mm, or less than 0.01 mm.

As additional examples, the cross-sectional area and/or the cross-sectional diameter of each vacuum opening 190 may be selected based, at least in part, on a rigidity of the wafer, on a resilience of the wafer, and/or on a strength of the vacuum that is applied to the wafer via vacuum openings 190. More specifically, the cross-sectional area and/or the cross-sectional diameter of the vacuum openings may be selected such that the wafer does not, at least significantly and/or observably, deform, or dimple, into the vacuum openings upon application of the vacuum.

As illustrated in FIGS. 1-4, wafer-contacting surfaces 120 may be supported by end effector body 110. As an example, the wafer-contacting surfaces may be defined by the end effector body. As another example, each wafer-contacting surface 120 may be defined by a contact projection 122 that extends and/or projects from the end effector body, as illustrated in FIGS. 2-4. As yet another example, each wafer-contacting surface 120 may be defined by an intermediate structure 140 that is operatively affixed to the end effector body, as also illustrated in FIGS. 2-4.

As illustrated in FIG. 2, wafer-contacting surfaces 120 may be located proximal to robot-distal end 114 of end effector body 110, may be located distal robot-proximal end 112 of the end effector body, and/or may be closer to the robot-distal end than to the robot-proximal end.

Each wafer-contacting surface 120 may define any suitable surface area, which also may be referred to herein as, and/or may be, a wafer-contacting surface area. For example, the surface area may be at least 0.1 square millimeters, at least 0.25 square millimeters, at least 0.5 square millimeters, at least 0.75 square millimeters, at least 1 square millimeter, at least 2 square millimeters, at least 3 square millimeters, at least 4 square millimeters, at least 5 square millimeters, at least 7.5 square millimeters, at least 10 square millimeters, at least 15 square millimeters, at least 25 square millimeters, at least 50 square millimeters, and/or at least 75 square millimeters. Additionally or alternatively, the surface area may be less than 250 square millimeters, less than 200 square millimeters, less than 150 square millimeters, less than 125 square millimeters, less than 100 square millimeters, less than 75 square millimeters, less than 50 square millimeters, less than 40 square millimeters, less than 30 square millimeters, less than 20 square millimeters, and/or less than 10 square millimeters.

Additionally or alternatively, the surface area of a given wafer-contacting surface 120 may be at least a threshold multiple of the cross-sectional area of respective vacuum opening 190 that is defined therein. For example, the threshold multiple may be at least 1 time, at least 2 times, at least 3 times, at least 4 times, at least 5 times, at least 10 times, at least 15 times, at least 20 times, at least 30 times, at least 40 times, at least 50 times, at least 75 times, at least 100 times, at least 200 times, at least 300 times, at least 400 times, at least 500 times, at least 1,000 times, at least 5,000 times, at least 10,000 times, at least 25,000 times, and/or at least 50,000 times the cross-sectional area of the respective vacuum opening. Additionally or alternatively, the threshold multiple may be less than 100,000 times, less than 75,000 times, less than 50,000 times, less than 25,000 times, less than 10,000 times, less than 5,000 times, less than 2,500 times, less than 1000 times, less than 500 times, less than 400 times, less than 300 times, less than 200 times, less than 100 times, less than 80 times, less than 60 times, less than 40 times, less than 20 times, or less than 10 times the cross-sectional area of the respective vacuum opening.

As additional examples, the surface area of a given wafer-contacting surface 120 may be selected based, at least in part, on a rigidity of the wafer, on a resilience of the wafer, on a degree of warping of the wafer, on a strength of the vacuum that is applied to the wafer via vacuum openings 190, on a predetermined surface area that provides a frictional force that is sufficient to retain the wafer on the end effector during motion of the end effector, on a predetermined surface area that provides a normal (i.e., pressure differential-generated) force that is sufficient to retain the wafer on the end effector during motion of the end effector and/or that prevents separation of the wafer from the end effector, on a maximum acceleration of the end effector, on a maximum deceleration of the end effector, and/or on a predetermined maximum air gap 80 (as illustrated in FIGS.

3-4). More specifically, the surface area of the given wafer-contacting surface 120 may be selected such that the wafer is retained on the end effector while the wafer is being moved by the end effector and/or such that air gap 80 is sufficiently small to draw the wafer into contact with the wafer-contacting surface, as discussed herein.

Vacuum opening 190 may include any suitable opening, hole, orifice, and/or fluid conduit that is defined within a respective wafer-contacting surface 120 and/or that extends between the respective wafer-contacting surface and the vacuum distribution manifold. Each wafer-contacting surface 120 may include and/or define a single vacuum opening 190 or a plurality of vacuum openings 190. As examples, each wafer-contacting surface 120 may include and/or define 2, 3, 4, 5, 6, 7, 8, 9, 10, or more than 10 vacuum openings 120.

As discussed, end effector 100 also may include sealing structures 130, and a respective sealing structure may be associated with each wafer-contacting surface 120. As discussed in more detail herein with reference to FIG. 7, the sealing structure may form a portion of and/or may define wafer-contacting surface 120. Additionally or alternatively, and as discussed in more detail herein with reference to FIGS. 8-13, the sealing structure may extend around, surround, and/or encompass a respective wafer-contacting surface 120.

In contrast to traditional sealing structures, which generally are compressed between two surfaces to form a seal, sealing structures 130 according to the present disclosure may be configured to form and/or improve the vacuum seal without being compressed between the wafer and the wafer-contacting surfaces. This may permit sealing structures 130 to form the vacuum seal without causing deformation of the wafer and/or without restricting contact between the wafer and the wafer-contacting surfaces.

Figure 8:
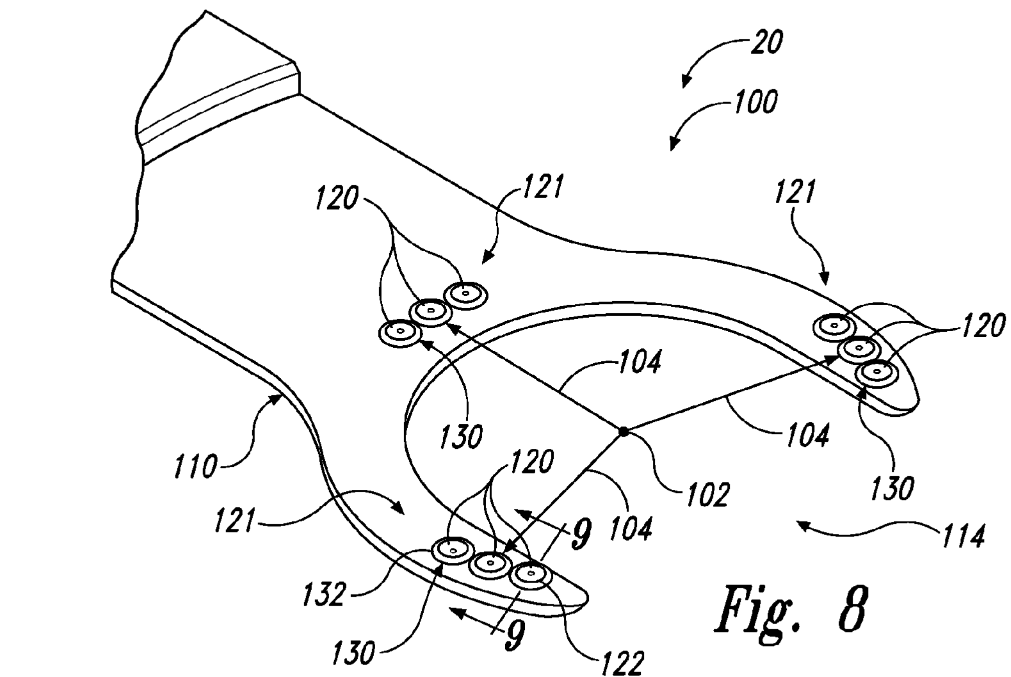
FIG. 8 is a less schematic profile view of a portion of another end effector according to the present disclosure.
Figure 9:
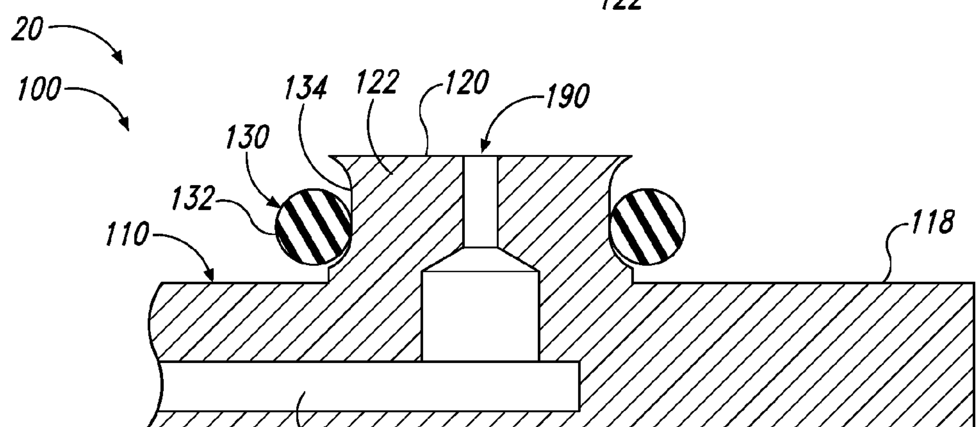
FIG. 9 is a cross-sectional view of the end effector of FIG. 8 taken along line 9-9 of FIG. 8.
Figure 10:
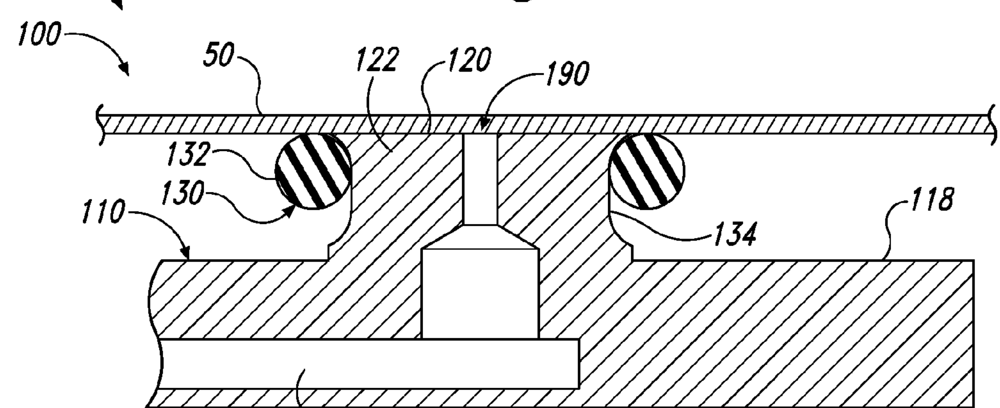
FIG. 10 is a fragmentary cross-sectional view of the end effector of FIG. 9 supporting a wafer.
Figure 11:
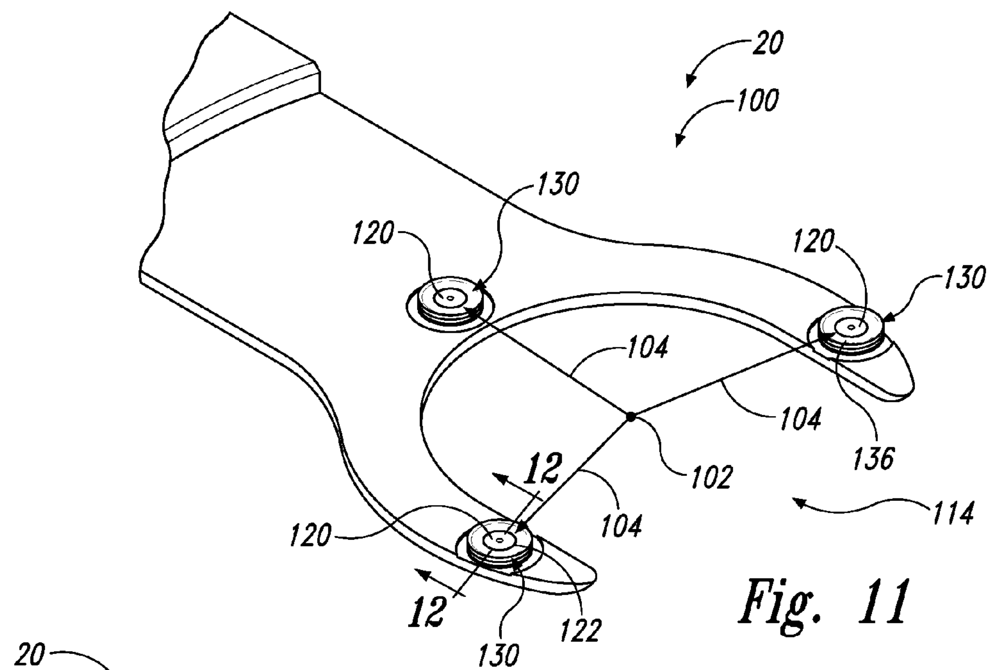
FIG. 11 is a less schematic profile view of a portion of another end effector according to the present disclosure.
Figure 12:
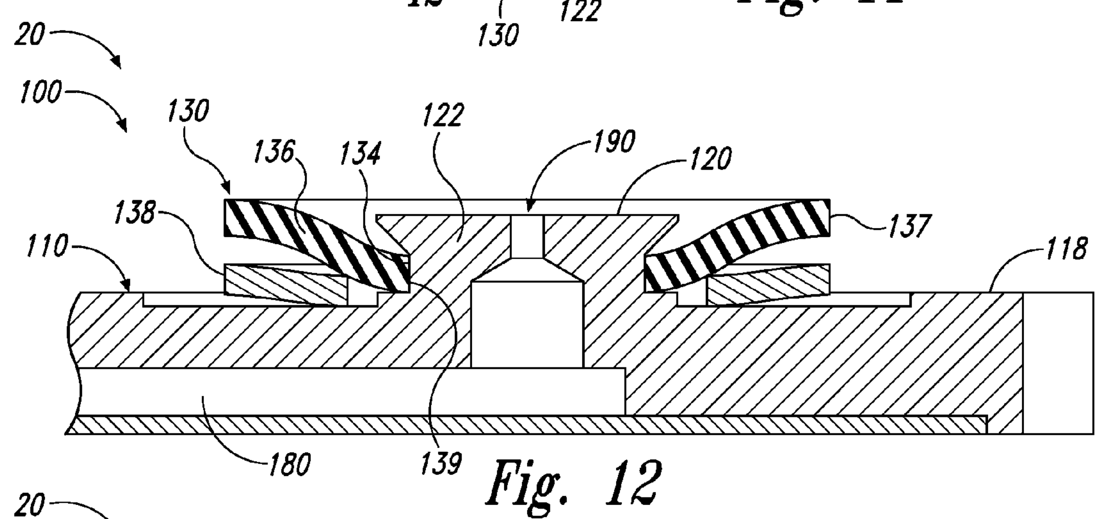
FIG. 12 is a cross-sectional view of the end effector of FIG. 10 taken along line 12-12 of FIG. 11.
Figure 13:
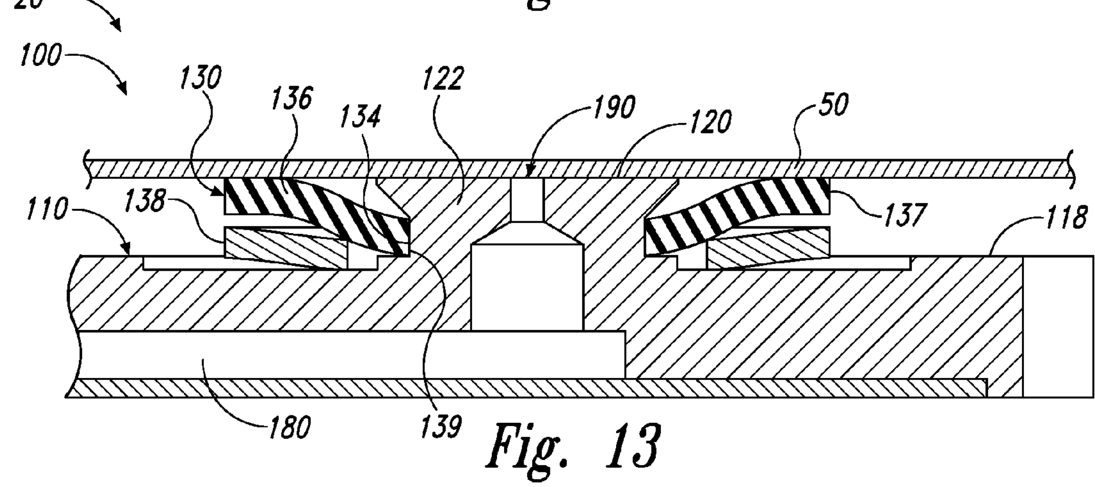
FIG. 13 is a fragmentary cross-sectional view of the end effector of FIG. 12 supporting a wafer.

Examples of sealing structures 130 include O-rings 132 (as illustrated in FIGS. 8-10 and discussed herein with reference thereto) and compliant gaskets 136 (as illustrated in FIGS. 11-13 and discussed herein with reference thereto) that may be formed from soft materials, from elastomeric materials, from silicone, and/or from a polyimide. As a more specific example, the sealing material may have and/or define less than a threshold Shore hardness and/or may have and/or define a Shore hardness that may be measured and/or characterized on the Shore A, Shore D, and/or Shore 00 hardness scales. The threshold Shore hardness, as measured on the Shore D scale, may be less than 100, less than 80, less than 60, less than 40, and/or less than 20. The threshold Shore hardness, as measured on the Shore A scale, may be less than 100, less than 80, less than 60, less than 50, less than 45, less than 40, less than 35, less than 30, less than 25, less than 20, less than 15, and/or less than 10. The Shore hardness, as measured on the Shore 00 scale, may be less than 100, less than 80, less than 60, less than 40, less than 20, less than 10, less than 5, less than 1, and/or substantially 0.

Surface alignment structure 150, when present, may include any suitable structure that is adapted, configured, designed, sized, and/or constructed to improve alignment between wafer-contacting surfaces 120 and wafer 50. For example, the surface alignment structure may be configured to permit a respective wafer-contacting surface 120 to rotate, pivot, and/or align with a surface of wafer 50 at a location where the wafer-contacting surface contacts the wafer. As examples, surface alignment structure 150 may include a gimbal and/or a pivot. As another example, surface alignment structure 150 also may include a compliant material that may be compressed between wafer-contacting surface 120 and end effector body 110 and/or that may permit at least limited motion of the wafer-contacting surface relative to the end effector body. Examples of the compliant material include an elastomeric material and/or an adhesive.

End effector body 110 may include and/or be any suitable structure that extends between robot-proximal end 112 and robot-distal end 114 and/or that supports wafer-contacting surfaces 120. For example, end effector body 110 may be an elongate end effector body that defines a longitudinal axis, with the longitudinal axis extending between the robot-proximal end and the robot-distal end.

As illustrated in FIGS. 1-2, end effector body 110 may include a mounting structure 116 that is configured to operatively attach end effector 100 to a transfer robot 30. Examples of mounting structure 116 include any suitable hole, bolt, nut, screw, and/or threaded opening.

It is within the scope of the present disclosure that end effector 100 and/or end effector body 110 thereof may be formed from any suitable material. For example, the end effector may be formed from a rigid material, a metallic material, a composite material (including, but not limited to, a carbon composite material), a plastic material, a ceramic material, steel, stainless steel, aluminum, anodized aluminum, copper, a polyimide, and/or combinations thereof. Additionally or alternatively, end effector 100, end effector body 110, and/or any suitable component thereof may be formed from a material that is suitable for use in a clean room, suitable for use in a semiconductor processing tool, suitable for use in a vacuum chamber, and/or suitable for use at a given point in a semiconductor manufacturing process where end effector 100 may be utilized. As an example, end effectors 100 that are utilized in a front-end portion of the semiconductor manufacturing process may not include and/or utilize copper, while end effectors 100 that are utilized in a back-end portion of the semiconductor manufacturing process may include and/or utilize copper.

Vacuum distribution manifold 180 may include any suitable structure that extends between, defines a fluid conduit that extends between, and/or that may be configured to convey a vacuum to, the plurality of wafer-contacting surfaces between the robot-proximal end of the end-effector body and the plurality of wafer-contacting surfaces, and/or between vacuum source 40 (as illustrated in FIG. 1) and the plurality of wafer-contacting surfaces. For example, the vacuum distribution manifold may be or include a flow passage, a tube, a pipe, a channel, and/or combinations or multiples thereof. It is within the scope of the present disclosure that vacuum distribution manifold 180 may be defined, partially or completely, within and/or by end effector body 110. However, it is also within the scope of the present disclosure that the vacuum distribution manifold may be defined by a manifold body that is separate and/or distinct from end effector body 110.

FIGS. 5-13 provide more detailed and/or specific examples of end effectors 100 and/or components thereof according to the present disclosure. End effectors 100 of FIGS. 5-13 may include and/or be end effectors 100 of FIGS. 1-4, and any of the components, structures, and/or features of end effectors 100 that are discussed herein with reference to any one of FIGS. 1-13 may be included in and or utilize with any other of FIGS. 1-13 without departing from the scope of the present disclosure.

Figure 5:
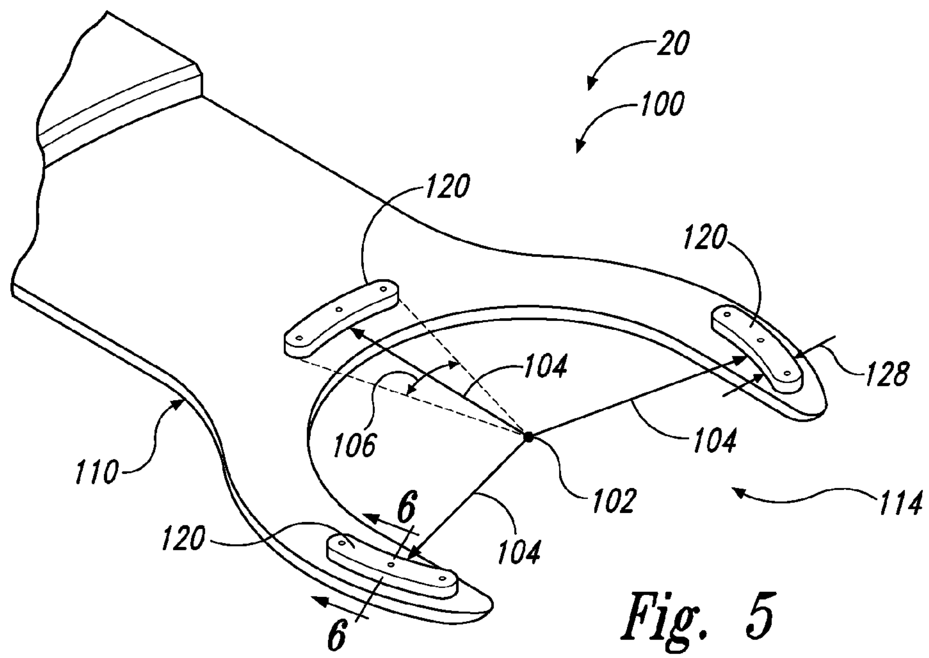
FIG. 5 is a less schematic profile view of a portion of an end effector according to the present disclosure.

As illustrated in FIGS. 5, 8, and 11, end effectors 100 may include a plurality of wafer-contacting surfaces 120. The plurality of wafer-contacting surfaces may be located and/or defined at a common distance, or radius, 104 from a central point 102. Additionally or alternatively, the wafer-contacting surfaces may extend circumferentially about the central point, as illustrated in FIGS. 5 and 8, and/or may be arcuate with a radius that is defined by the common distance, as illustrated in FIG. 5. This may permit a center of mass of the wafer to be at, or near, central point 102 when the wafer is transferred and/or conveyed by end effector 100.

In addition, and as discussed, wafer-contacting surfaces 120 according to the present disclosure may be planar, or at least substantially planar, may define a wafer contact plane 124 (as illustrated in FIG. 2), and/or may be oriented and/or configured for at least partial (or even complete) face-to-face contact with the wafer and/or for direct face-to-face contact with the wafer when the wafer is transferred by the end effector. This is in contrast with conventional end effectors, which may utilize wafer-contacting surfaces that take the form of an edge and/or ring contact region between the wafer and the conventional end effectors.

When wafer-contacting surfaces 120 extend circumferentially about central point 102, each of the wafer-contacting surfaces may define less than a threshold sweep angle 106 about the central point (as illustrated in FIG. 5). For example, the sweep angle may be less than 120 degrees, less than 100 degrees, less than 80 degrees, less than 60 degrees, less than 45 degrees, less than 40 degrees, less than 35 degrees, less than 30 degrees, less than 25 degrees, less than 20 degrees, less than 15 degrees, or less than 10 degrees. As additional examples, the sweep angle may be at least 0.25 degrees, at least 0.5 degrees, at least 0.75 degrees, at last 1 degree, at least 2 degrees, at least 3 degrees, at least 4 degrees, at least 5 degrees, at least 10 degrees, or at least 15 degrees. As further examples, the sweep angle may be in the range of 5-35 degrees, 10-30 degrees, 10-25 degrees, 15-30 degrees, or 15-25 degrees.

As discussed in more detail herein with reference to FIGS. 3-4, a width 128, which also may be referred to herein as a radial extent 128, of wafer-contacting surfaces 120 may be selected to permit formation of the vacuum seal between the wafer and the wafer-contacting surfaces. As illustrated in FIG. 5, radial extent 128 may be measured in a radial direction from central point 102.

As also illustrated in FIGS. 5, 8, and 11, end effector 100 may include three wafer-contacting surfaces 120 and/or the wafer-contacting surfaces may define three wafer contact regions 121 (as illustrated in FIG. 8) that are spaced apart around central point 102. This may permit end effector 100 to form a quasi-three-point contact with the wafer and/or may permit each wafer-contacting surface to contact the wafer and/or form the vacuum seal regardless of the actual shape and/or surface conformation of the wafer. When end effector 100 includes three wafer-contacting surfaces and/or regions, each of the three wafer-contacting surfaces and/or regions may be located at a (substantially) 120 degree angle relative to the other wafer-contacting surfaces and/or regions. This may uniformly distribute support of the wafer among the three wafer-contacting surfaces and/or regions; however, this configuration is not required.

While FIGS. 5, 8, and 11 illustrate end effectors 100 with three wafer-contacting surfaces 120, it is within the scope of the present disclosure that end effector 100 may include and/or utilize any suitable number of wafer-contacting surfaces 120. As examples, end effector 100 may include at least 1, at least 2, at least 3, at least 4, at least 5, at least 6, at least 8, or at least 10 wafer-contacting surfaces 120 without departing from the scope of the present disclosure.

As also illustrated in FIGS. 5, 8, and 11, robot-distal end 114 of end effector 100 may be (at least substantially) U-shaped. This may provide clearance between the wafer and the end effector whether the wafer contacts the end effector with a concave side or with a convex side. Additionally or alternatively, this also may provide clearance for lift pins and/or alignment chucks, which may be utilized to align the wafer within semiconductor manufacturing device 20 and/or remove the wafer from the end effector within the semiconductor manufacturing device, respectively. When the end effector is U-shaped, and as illustrated, one wafer-contacting surface 120 may be located near each end of the U, while the other wafer-contacting surface may be located near a base of the U.

Figure 6:
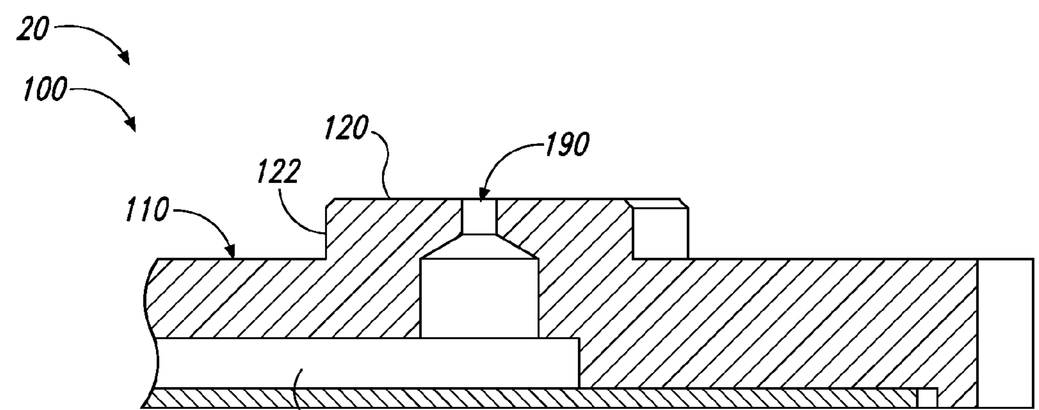
FIG. 6 is a cross-sectional view of the end effector of FIG. 5 taken along line 6-6 of FIG. 5.
Figure 7:
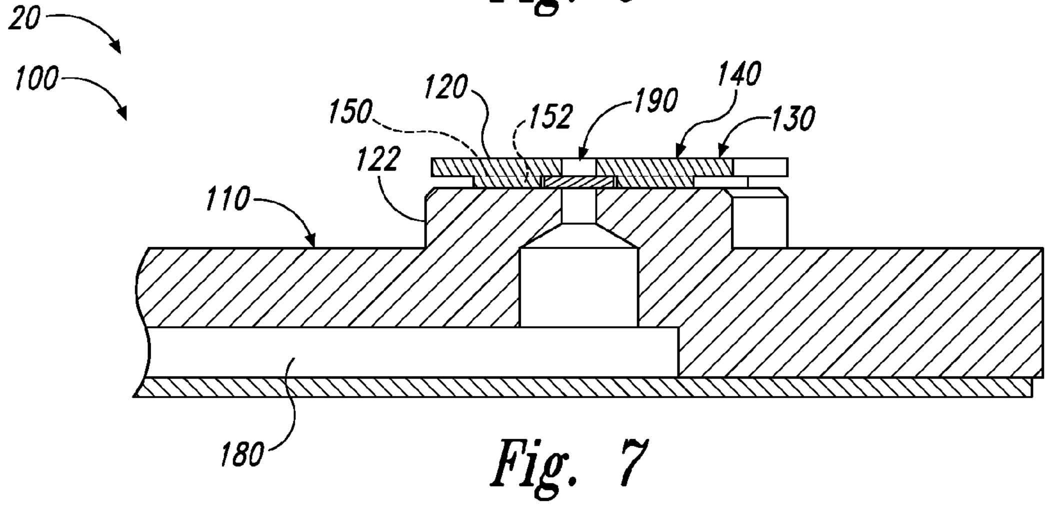
FIG. 7 is an alternative cross-sectional view of the end effector of FIG. 5 taken along line 6-6 of FIG. 5.

FIG. 6 is a cross-sectional view of the end effector of FIG. 5 taken along line 6-6 of FIG. 5, and FIG. 7 is an alternative cross-sectional view of the end effector of FIG. 5 taken along line 6-6 of FIG. 5. As illustrated in FIG. 6, wafer-contacting surface 120 may be defined by a contact projection 122 that extends from, and/or is defined by, end effector body 110. As also illustrated, both vacuum distribution manifold 180 and vacuum opening 190 may be defined by the end effector body.

Alternatively, and as illustrated in FIG. 7, wafer-contacting surface 120 may be defined by an intermediate structure 140. The intermediate structure may function as a sealing structure 130 (e.g., by improving the vacuum seal between wafer-contacting surface 120 and a wafer 50) and/or as a surface alignment structure 150 (e.g., by compressing in one region more than another to account for small differences in the plane of the wafer relative to the wafer-contacting surface). Alternatively, the end effector also may include a separate surface alignment structure 150 in the form of a compliant material 152 that extends between intermediate structure 140 and contact projection 122. Under these conditions, intermediate structure 140 may be a rigid, or at least substantially rigid, intermediate structure 140, such as a polyimide material.

FIG. 9 is a cross-sectional view of the end effector of FIG. 8 taken along line 9-9 of FIG. 8, and FIG. 10 is a cross-sectional view of the end effector of FIGS. 8-9 supporting a wafer 50. End effector 100 of FIGS. 8-10 includes a contact projection 122 that extends from end effector body 110 and defines wafer-contacting surface 120. The end effector further includes a sealing structure 130 in the form of an O-ring 132 that extends around wafer-contacting surface 120.

The O-ring is retained within a groove 134 that is defined by and/or within contact projection 122. As illustrated in FIGS. 8-9, groove 134 may be oversized relative to O-ring 132 to permit limited translation of the O-ring in a direction that is normal to wafer-contacting surface 120. By "oversized," it is meant that the groove defines a transverse opening, or recess, that is larger (in size, radius, etc.) than the corresponding portion of the O-ring that is received in the groove.

In addition, groove 134 may be located such that O-ring 132 does not contact an upper surface 118 of end effector body 110 when a wafer is located on the end effector. In such a configuration, the O-ring may form and/or contribute to a seal with the wafer without also being deformed or otherwise compressed against the end effector body. Thus, when the wafer is located on the end effector and/or in contact with wafer-contacting surface 120 and the vacuum is applied to vacuum distribution manifold 180, a low pressure is created between the wafer and the O-ring. As illustrated in FIG. 10, this low pressure pulls the O-ring into contact with the wafer, thus generating and/or improving the vacuum seal, without the O-ring being compressed between the wafer and the wafer-contacting surface and/or without the O-ring being compressed between the wafer and the end effector body. In addition, and as illustrated in dash-dot lines in FIG. 10, this low pressure also may deform O-ring 132 and/or conform at least a portion of an outer surface of O-ring 132 to a shape of wafer 50 and/or of contact projection 122.

FIG. 12 is a cross-sectional view of the end effector of FIG. 11 taken along line 12-12 of FIG. 11, and FIG. 13 is a cross-sectional view of the end effector of FIGS. 11-12 supporting a wafer 50. End effector 100 of FIGS. 11-13 includes a contact projection 122 that defines a wafer-contacting surface 120. The end effector further includes a sealing structure 130 in the form of a compliant gasket 136. Gasket 136 may be formed from any suitable compliant and/or flexible material that may be selectively utilized to form a seal with the wafer. Gasket 136 may be formed from a material that does not readily stick to the wafer, such as silicone.

Gasket 136 extends around contact projection 122 and, when wafer 50 is not present, at least an outer edge 137 of the gasket extends above (i.e., farther away from end effector body 110 than) wafer-contacting surface 120 (as illustrated in FIG. 12). Accordingly, when end effector 100 is moved into contact with a wafer, outer edge 137 of compliant gasket 136 contacts the wafer before other portions of the end effector.

As illustrated and perhaps best seen in FIG. 12, compliant gasket 136 may be described as having a convex configuration, relative to the end effector body 110, with outer edge 137 extending away from the end effector body. Similar to the O-ring of FIGS. 8-10, the compliant gasket of FIGS. 11-13 additionally or alternatively may be described as being retained within a groove 134 that is defined by and/or within contact projection 122. In FIGS. 12-13, groove 134 additionally or alternatively may be described as a neck, waist, and/or outer perimeter portion 134 of contact projection 122.

Compliant gasket 136 may be positioned and/or oriented around contact projection 122 in any suitable manner. As an example, when compliant gasket 136 has an orifice, or central opening, 139 with a smaller inner diameter, or inner perimeter, than the outer diameter, or outer perimeter, of the neck, groove, or other outer perimeter portion 134 of contact projection 122 around which it extends, then stretching the gasket around portion 134 may bias the gasket to the convex configuration shown in FIG. 12. In addition, end effector 100 may include an orientation-regulating structure 138. The orientation-regulating structure is located or otherwise positioned to contact compliant gasket 136 and to urge outer edge, or outer edge region, 137 of the compliant gasket away from an upper surface 118 of end effector body 110. Thus, and when a wafer 50 is located on end effector 100 and/or in contact with wafer-contacting surface 120, the wafer contacts outer edge 137, as illustrated in FIG. 13. This permits compliant gasket 136 to form a vacuum seal with the wafer when a vacuum is applied to vacuum distribution manifold 180 without compression of the compliant gasket between wafer 50 and wafer-contacting surface 120, orientation-regulating structure 138, and/or upper surface 118.

Orientation-regulating structure 138, when present, may be formed from any suitable material, and may have a rigid, semi-rigid, or compliant construction. Orientation-regulating structure 138 may be a separate structure that is secured to end effector body 110, contact projection 122, and/or even compliant gasket 136. Alternatively, orientation-regulating structure 138 may be formed with and/or as an integral part of the end effector body and/or the contact projection. Although illustrated as a ring of material that extends under compliant gasket 136 with a smaller outer diameter, or outer perimeter, than compliant gasket 136, orientation-regulating structure 138, when present, may have other shapes and/or sizes, including being coextensive with or larger in outer diameter than the compliant gasket, not extending completely around contact projection 122, extending from upper surface 118 of end effector body 110 but not in contact with contact projection 122, etc.

Wafer 50 may include and/or be any suitable structure. For example, the wafer may be a semiconductor wafer, a silicon wafer, a gallium arsenide wafer, a silicon carbide wafer, and/or a Group III-V semiconductor wafer. It is within the scope of the present disclosure that the wafer may have any suitable diameter, that end effector 100 may be utilized with a wafer 50 of any suitable diameter, and/or that a single end effector 100 may be configured to form the vacuum seal with a plurality of different wafers 50 that have a plurality of different diameters, a plurality of different thicknesses, and/or a plurality of different bow depths 52 (as illustrated in FIGS. 3-4). As a specific example, a specific end effector 100 according to the present disclosure may be configured to transfer and/or form the vacuum seal with wafers of any diameter between 50 millimeters (mm) and 150 mm, including wafers with nominal diameters of 50 mm (2 inches), 75 mm (3 inches), 100 mm (4 inches), and 150 mm (6 inches).

As examples, wafers 50 may have a diameter of at least 25 millimeters (mm), at least 50 mm, at least 75 mm, at least 100 mm, at least 125 mm, at least 150 mm, at least 200 mm, at least 300 mm, and/or at least 450 mm. Additionally or alternatively, wafers 50 may have a diameter of less than 450 mm, less than 300 mm, less than 200 mm, and/or less than 150 mm.

As further examples, wafers 50 may have a thickness of at least 10 micrometers, at least 20 micrometers, at least 30 micrometers, at least 40 micrometers, at least 50 micrometers, at least 60 micrometers, at least 70 micrometers, at least 80 micrometers, at least 90 micrometers, at least 100 micrometers, at least 250 micrometers, at least 500 micrometers, at least 750 micrometers, and/or at least 1 millimeter. Additionally or alternatively, wafers 50 may have a thickness of less than 10 millimeters, less than 8 millimeters, less than 6 millimeters, less than 4 millimeters, less than 2 millimeters, less than 1 millimeter, less than 900 micrometers, less than 800 micrometers, less than 700 micrometers, less than 600 micrometers, less than 500 micrometers, less than 400 micrometers, less than 300 micrometers, less than 200 micrometers, and/or less than 100 micrometers.

As additional examples, wafers 50 may have a bow depth 52 (as illustrated in FIGS. 3-4) of at least 0.25 millimeters (mm), at least 0.5 mm, at least 0.75 mm, at least 1 mm, at least 2 mm, at least 3 mm, at least 4 mm, and/or at least 5 mm. Additionally or alternatively, wafers 50 may have a bow depth 52 of less than 10 mm, less than 9 mm, less than 8 mm, less than 7 mm, less than 6 mm, less than 5 mm, less than 4 mm, less than 3 mm, less than 2 mm, and/or less than 1.5 mm. Bow depth 52 may be measured from a top surface of the wafer (i.e., for a concave up wafer and/or for a wafer with a concave side that faces away from the end effector, as illustrated in FIG. 3. Additionally or alternatively, bow depth 52 also may be measured from a bottom surface of the wafer (i.e., for a concave down wafer and/or for a wafer with a concave side that faces toward the end effector, as illustrated in FIG. 4).

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

Examples of wafer-handling end effectors and semiconductor manufacturing devices that include the wafer-handling end effectors are presented in the following enumerated paragraphs.

A1. An end effector configured to transfer a wafer, the end effector comprising:

an end effector body that defines a robot-proximal end and a robot-distal end;

a plurality of wafer-contacting surfaces, wherein each of the plurality of wafer-contacting surfaces is supported by the end effector body and configured to form an at least partially face-to-face contact with the wafer;

a vacuum distribution manifold that extends between the robot-proximal end and the plurality of wafer-contacting surfaces;

a plurality of vacuum openings that is defined within the plurality of wafer-contacting surfaces and extends between the plurality of wafer-contacting surfaces and the vacuum distribution manifold; and a plurality of sealing structures, wherein each of the plurality of sealing structures is associated with a respective one of the plurality of wafer-contacting surfaces.

A2. The end effector of paragraph A1, wherein each of the plurality of wafer-contacting surfaces is defined at a common distance from a central point, and optionally wherein each of the plurality of wafer-contacting surfaces is radially distributed about the central point.

A2.1. The end effector of paragraph A2, wherein each of the plurality of wafer-contacting surfaces is arcuate at the common distance.

A2.2. The end effector of any of paragraphs A2-A2.1, wherein each of the plurality of wafer-contacting surfaces extends circumferentially about the central point.

A3. The end effector of any of paragraphs A2-A2.2, wherein each of the plurality of wafer-contacting surfaces defines less than a threshold sweep angle about the central point.

A3.1. The end effector of paragraph A3, wherein the threshold sweep angle is less than 120 degrees, less than 100 degrees, less than 80 degrees, less than 60 degrees, less than 45 degrees, less than 40 degrees, less than 35 degrees, less than 30 degrees, less than 25 degrees, less than 20 degrees, less than 15 degrees, or less than 10 degrees.

A3.2 The end effector of any of paragraphs A3-A3.1, wherein the threshold sweep angle is at least 0.25 degrees, at least 0.5 degrees, at least 0.75 degrees, at last 1 degree, at least 2 degrees, at least 3 degrees, at least 4 degrees, at least 5 degrees, at least 10 degrees, or at least 15 degrees.

A4. The end effector of any of paragraphs A2-A3.2, wherein each of the plurality of wafer-contacting surfaces defines a radial extent as measured in a radial direction from the central point.

A4.1. The end effector of paragraph A4, wherein the radial extent is at least one of:

(i) at least 0.4 millimeters (mm), at least 0.5 mm, at least 0.6 mm, at least 0.7 mm, at least 0.8 mm, at least 0.9 mm, at least 1 mm, at least 2 mm, at least 3 mm, at least 4 mm, at least 5 mm, at least 6 mm, at least 7 mm, at least 8 mm, at least 9 mm, at least 10 mm, at least 12 mm, or at least 14 mm;

(ii) less than 20 mm, less than 18 mm, less than 16 mm, less than 14 mm, less than 12 mm, less than 10 mm, less than 8 mm, less than 6 mm, or less than 4 mm; and (iii) within a range that is defined between any one of A4.2 (i) and any one of A4.2 (ii).

A5. The end effector of any of paragraphs A1-A4.1, wherein each of the plurality of wafer-contacting surfaces defines a wafer-contacting surface area.

A5.1. The end effector of paragraph A5, wherein the wafer-contacting surface area is at least one of:

(i) at least 0.1 square millimeters, at least 0.25 square millimeters, at least 0.5 square millimeters, at least 0.75 square millimeters, at least 1 square millimeter, at least 2 square millimeters, at least 3 square millimeters, at least 4 square millimeters, at least 5 square millimeters, at least 7.5 square millimeters, at least 10 square millimeters, at least 15 square millimeters, at least 25 square millimeters, at least 50 square millimeters, and/or at least 75 square millimeters;

(ii) less than 250 square millimeters, less than 200 square millimeters, less than 150 square millimeters, less than 125 square millimeters, less than 100 square millimeters, less than 75 square millimeters, less than 50 square millimeters, less than 40 square millimeters, less than 30 square millimeters, less than 20 square millimeters, or less than 10 square millimeters; and (iii) within a range that is defined between any one of 5.1 (i) and any one of 5.1 (ii).

A5.2. The end effector of any of paragraphs A5-A5.1, wherein the wafer-contacting surface area is at least a threshold multiple of a cross-sectional area of a respective vacuum opening of the plurality of vacuum openings that is defined in the wafer-contacting surface.

A5.2.1. The end effector of paragraph A5.2, wherein the threshold multiple is at least 1 time, at least 2 times, at least 3 times, at least 4 times, at least 5 times, at least 10 times, at least 15 times, at least 20 times, at least 30 times, at least 40 times, at least 50 times, at least 75 times, at least 100 times, at least 200 times, at least 300 times, at least 400 times, at least 500 times, at least 1,000 times, at least 5,000 times, at least 10,000 times, at least 25,000 times, and/or at least 50,000 times the cross-sectional area of the respective vacuum opening.

A5.2.2 The end effector of any of paragraphs A5.2-A5.2.1, wherein the threshold multiple is less than 100,000 times, less than 75,000 times, less than 50,000 times, less than 25,000 times, less than 10,000 times, less than 5,000 times, less than 2,500 times, less than 1000 times, less than 500 times, less than 400 times, less than 300 times, less than 200 times, less than 100 times, less than 80 times, less than 60 times, less than 40 times, less than 20 times, or less than 10 times the cross-sectional area of the respective vacuum opening.

A6. The end effector of any of paragraphs A1-A5.2.2, wherein each of the plurality of wafer-contacting surfaces is at least substantially rigid.

A6.1. The end effector of paragraph A6, wherein each of the plurality of wafer-contacting surfaces defines a Brinell hardness of at least 1 HB, at least 5 HB, at least 10 HB, at least 15 HB, at least 20 HB, at least 40 HB, at least 60 HB, at least 80 HB, at least 100 HB, at least 200 HB, at least 300 HB, at least 400 HB, at least 500 HB, at least 600 HB, at least 700 HB, at least 800 HB, at least 900 HB, or at least 1000 HB.

A7. The end effector of any of paragraphs A1-A6.1, wherein each of the plurality of wafer-contacting surfaces is an at least substantially planar wafer-contacting surface.

A8. The end effector of any of paragraphs A1-A7, wherein each of the plurality of wafer-contacting surfaces is defined by the end effector body.

A9. The end effector of any of paragraphs A1-A8, wherein each of the plurality of wafer-contacting surfaces is proximal the robot-distal end of the end effector body.

A10. The end effector of any of paragraphs A1-A9, wherein each of the plurality of wafer-contacting surface is defined by a contact projection that extends from the end effector body.

A10.1. The end effector of paragraph A10, wherein the contact projection defines a groove that is sized to receive and retain a respective sealing structure of the plurality of sealing structures.

A10.1.1. The end effector of paragraph A10.1, wherein the sealing structure includes a/the O-ring, and further wherein the groove is oversized relative to the O-ring to permit limited translation of the O-ring in a direction that is normal to a respective wafer-contacting surface that is defined by the contact projection.

A10.12. The end effector of paragraph A10.1, wherein the sealing structure includes a compliant gasket, and further wherein the groove is sized to retain the compliant gasket.

A10.1.2.1. The end effector of paragraph A10.1.2, wherein the compliant gasket includes a central opening, wherein the contact projection extends within the central opening.

A10.1.2.1.1. The end effector of paragraph A10.1.2.1, wherein the central opening and the groove are sized such that the compliant gasket has a convex configuration relative to the end effector body.

A10.1.2.2. The end effector of any of paragraphs A10.1.2-A10.1.2.1.1, wherein the end effector further includes an orientation regulating structure located to contact the compliant gasket and to urge an outer edge of the compliant gasket away from an upper surface of the end effector body.

A11. The end effector of any of paragraphs A1-A10, wherein the plurality of wafer-contacting surfaces defines a wafer contact plane.

A12. The end effector of any of paragraphs A1-A11, wherein each of the plurality of wafer-contacting surfaces is coplanar with a remainder of the plurality of wafer-contacting surfaces to within a threshold tolerance.

A12.1. The end effector of paragraph A12, wherein the threshold tolerance is less than 5 millimeters, less than 4 millimeters, less than 3 millimeters, less than 2 millimeters, less than 1 millimeters, less than 800 micrometers, less than 600 micrometers, less than 400 micrometers, less than 200 micrometers, less than 150 micrometers, less than 100 micrometers, less than 75 micrometers, less than 50 micrometers, less than 25 micrometers, or less than 10 micrometers.

A12.2. The end effector of any of paragraphs A12-A12.1, wherein the threshold tolerance is less than a threshold fraction of a thickness of the wafer.

A12.2.1. The end effector of paragraph A12.2, wherein the threshold fraction is less than 100%, less than 75%, less than 50%, less than 40%, less than 30%, less than 20%, less than 10%, or less than 5% of the thickness of the wafer.

A13. The end effector of any of paragraphs A1-A12.2.1, wherein each of the plurality of wafer-contacting surfaces is at least substantially fixed relative to a remainder of the plurality of wafer-contacting surfaces.

A14. The end effector of any of paragraphs A1-A13, wherein the plurality of wafer-contacting surfaces defines three wafer contact regions that are spaced apart around a/the central point.

A14.1. The end effector of paragraph A14, wherein each of the three wafer contact regions is located at a substantially 120 degree angle relative to the other of the three wafer contact regions.

A15. The end effector of any of paragraphs A1-A14.1, wherein each of the plurality of wafer-contacting surfaces defines one vacuum opening of the plurality of vacuum openings, optionally at least one vacuum opening of the plurality of vacuum openings, and further optionally more than one vacuum opening of the plurality of vacuum openings.

A16. The end effector of any of paragraphs A1-A15, wherein each of the plurality of vacuum openings is defined within a respective wafer-contacting surface of the plurality of wafer-contacting surfaces such that the wafer is pulled into contact with the respective wafer-contacting surface upon application of a vacuum to the vacuum distribution manifold.

A17. The end effector of any of paragraphs A1-A16, wherein a diameter of each of the plurality of vacuum openings is less than a threshold percentage of a/the thickness of the wafer.

A17.1. The end effector of paragraph A17, wherein the threshold percentage of the thickness of the wafer is less than 2000%, less than 1800%, less than 1600%, less than 1400%, less than 1200%, less than 1000%, less than 800%, less than 700%, less than 600%, less than 500%, less than 400%, less than 300%, less than 200%, or less than 100% of the thickness of the wafer.

A18. The end effector of any of paragraphs A1-A17.1, wherein each of the plurality of sealing structures defines the respective one of the plurality of wafer-contacting surfaces.

A18.1. The end effector of any of paragraphs A1-A18, wherein each of the plurality of sealing structures extends around the respective one of the plurality of wafer-contacting surfaces.

A18.2. The end effector of any of paragraphs A1-A18.1, wherein each of the plurality of sealing structures is configured to form a vacuum seal between the wafer and the respective one of the plurality of wafer-contacting surfaces.

A18.2.1. The end effector of paragraph A18.2, wherein each of the plurality of sealing structures is configured to form the vacuum seal without being compressed between the wafer and the respective one of the plurality of wafer-contacting surfaces.

A18.2.2. The end effector of any of paragraphs A18.2-A18.2.1, wherein each of the plurality of sealing structures is configured to form the vacuum seal based upon a pressure differential across the sealing structure.

A18.2.3. The end effector of any of paragraphs A18.2-A18.2.2, wherein each of the plurality of sealing structures is configured to be drawn into pressing engagement with the wafer by a/the pressure differential across the sealing structure.

A18.3. The end effector of any of paragraphs A1-A18.2.3, wherein the plurality of sealing structures includes at least one of a plurality of O-rings and a plurality of compliant gaskets.

A18.4. The end effector of any of paragraphs A1-A18.3, wherein each sealing structure of the plurality of sealing structures is formed from at least one of a soft material, an elastomeric material, a silicone, and a polyimide.

A18.5. The end effector of any of paragraphs A1-A18.4, wherein each sealing structure of the plurality of sealing structures has less than a threshold Shore hardness.

A18.5.1. The end effector of paragraph A18.5, wherein the threshold Shore hardness, as measured on the Shore D scale, is less than 100, less than 80, less than 60, less than 40, and/or less than 20.

A18.5.2. The end effector of any of paragraphs A18.5-A18.5.1, wherein the threshold Shore hardness, as measured on the Shore A scale, is less than 100, less than 80, less than 60, less than 50 A, less than 45 A, less than 40 A, less than 35 A, less than 30 A, less than 25 A, less than 20 A, less than 15 A, and/or less than 10 A.

A18.5.3. The end effector of any of paragraphs A18.5-A18.5.2, wherein the threshold Shore hardness, as measured on the Shore 00 scale, is less than 100, less than 80, less than 60, less than 40, less than 20, less than 10, less than 5, less than 1, and/or substantially 0.

A18.6. The end effector of any of paragraphs A1-A18.5.3, wherein the plurality of sealing structures includes a plurality of elastomeric sealing structures.

A18.7. The end effector of any of paragraphs A1-A18.6, wherein the plurality of sealing structures includes a plurality of compliant sealing structures.

A19. The end effector of any of paragraphs A1-A18.7, wherein the end effector further includes a surface alignment structure that is configured to align a respective wafer-contacting surface of the plurality of wafer-contacting surfaces with a surface of the wafer at a location where the respective wafer-contacting surface contacts the surface of the wafer.

A19.1. The end effector of paragraph A19, wherein the surface alignment structure includes at least one of a gimbal and a pivot.

A19.2. The end effector of any of paragraphs A19-A19.1, wherein the surface alignment structure includes a compliant material that is compressed between the respective wafer-contacting surface and the end effector body.

A19.2.1. The end effector of paragraph A19.2, wherein the compliant material includes at least one of an elastomeric material and an adhesive.

A20. The end effector of any of paragraphs A1-A19.2.1, wherein the end effector body is an elongate end effector body that defines a longitudinal axis that extends between the robot-proximal end and the robot-distal end.

A21. The end effector of any of paragraphs A1-A20, wherein the end effector body defines a generally U-shaped robot-distal end.

A22. The end effector of any of paragraphs A1-A21, wherein the end effector further includes a mounting structure that is configured to operatively attach the end effector to a transfer robot.

A23. The end effector of any of paragraphs A1-A22, wherein the end effector is formed from at least one of a rigid material, a metallic material, a composite material, a ceramic material, a plastic material, and/or combinations thereof.

A23.1. The end effector of any of paragraphs A1-A23, wherein the end effector is formed from at least one of stainless steel, aluminum, and a carbon composite.

A24. The end effector of any of paragraphs A1-A23.1, wherein the vacuum distribution manifold is at least partially, and optionally completely, defined by the end effector body.

A25. The end effector of any of paragraphs A1-A24, wherein the wafer is a warped wafer.

A26. The end effector of any of paragraphs A1-A25, wherein the wafer is nonplanar.

A27. The end effector of any of paragraphs A1-A26, wherein the wafer defines a concave side and a convex side.

A27.1. The end effector of paragraph A27, wherein the end effector is configured to contact the concave side.

A27.2. The end effector of any of paragraphs A27-A27.1, wherein the end effector is configured to contact the convex side.

A28. The end effector of any of paragraphs A1-A27.2, wherein the wafer defines a bow depth that is at least one of:

(i) at least 0.25 millimeters (mm), at least 0.5 mm, at least 0.75 mm, at least 1 mm, at least 2 mm, at least 3 mm, at least 4 mm, or at least 5 mm;

(ii) less than 10 mm, less than 9 mm, less than 8 mm, less than 7 mm, less than 6 mm, less than 5 mm, less than 4 mm, less than 3 mm, less than 2 mm, or less than 1.5 mm; and (iii) within a range that is defined between any one of A28 (i) and any one of A28 (ii).

A29. The end effector of any of paragraphs A1-A28, wherein a/the thickness of the wafer is at least one of:

at least 10 micrometers, at least 20 micrometers, at least 30 micrometers, at least 40 micrometers, at least 50 micrometers, at least 60 micrometers, at least 70 micrometers, at least 80 micrometers, at least 90 micrometers, at least 100 micrometers, at least 250 micrometers, at least 500 micrometers, at least 750 micrometers, or at least 1 millimeter;

(ii) less than 10 millimeters, less than 8 millimeters, less than 6 millimeters, less than 4 millimeters, less than 2 millimeters, less than 1 millimeter, less than 900 micrometers, less than 800 micrometers, less than 700 micrometers, less than 600 micrometers, less than 500 micrometers, less than 400 micrometers, less than 300 micrometers, less than 200 micrometers, or less than 100 micrometers; and (iii) within a range that is defined between any one of A29 (i) and any one of A29 (ii).

A30. The end effector of any of paragraphs A1-A29, wherein the wafer has a diameter that is at least one of:

(i) at least 25 millimeters (mm), at least 50 mm, at least 75 mm, at least 100 mm, at least 125 mm, at least 150 mm, at least 200 mm, at least 300 mm, or at least 450 mm;

(ii) less than 450 mm, less than 300 mm, less than 200 mm, or less than 150 mm; and (iii) within a range that is defined between any one of A30 (i) and any one of A30 (ii).

A31. The end effector of any of paragraphs A1-A30, wherein the wafer includes at least one of a semiconductor wafer, a silicon wafer, a gallium arsenide wafer, a silicon carbide wafer, and a Group III-V semiconductor wafer.

A32. The end effector of any of paragraphs A1-A31, wherein the wafer includes a plurality of electronic devices.

A33. The end effector of any of paragraphs A1-A32, in combination with the wafer, wherein the wafer is supported on the plurality of wafer-contacting surfaces.

B1. A semiconductor manufacturing device, comprising:

a transfer robot;

an end effector, wherein the end effector includes the end effector of any of paragraphs A1-A33; and a vacuum source, wherein the vacuum source is configured to apply a/the vacuum to the vacuum distribution manifold.

B2. The device of paragraph B1, wherein the device further includes the wafer.

B3. The device of any of paragraphs B1-B2, wherein the device further includes a chuck.

B4. The device of any of paragraphs B1-B3, wherein the semiconductor manufacturing device includes at least one of a test system, a probe system, an engineering system, a high volume manufacturing system, and a wafer processing system.

INDUSTRIAL APPLICABILITY

The systems and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. An end effector configured to transfer a wafer, the end effector comprising:

an end effector body that defines a robot-proximal end and a robot-distal end;

a plurality of wafer-contacting surfaces, wherein each of the plurality of wafer-contacting surfaces is supported by the end effector body and configured to form an at least partially face-to-face contact with the wafer;

a vacuum distribution manifold that extends between the robot-proximal end and the plurality of wafer-contacting surfaces;

a plurality of vacuum openings that is defined within the plurality of wafer-contacting surfaces and extends between the plurality of wafer-contacting surfaces and the vacuum distribution manifold, wherein each of the plurality of wafer-contacting surfaces defines a wafer-contacting surface area that is at least 3 times a cross-sectional area of a respective vacuum opening of the plurality of vacuum openings that is defined in a respective wafer-contacting surface of the plurality of wafer-contacting surfaces; and a plurality of sealing structures, wherein each of the plurality of sealing structures is operatively attached to a respective contact projection that extends from the end effector body and defines a respective one of the plurality of wafer-contacting surfaces, wherein the respective contact projection defines a groove that is sized to receive and retain a respective sealing structure of the plurality of sealing structures, and further wherein each of the plurality of sealing structures is configured to directly and physically contact a corresponding region of the wafer to form a vacuum seal between the wafer and the respective one of the plurality of wafer-contacting surfaces without being compressed between the wafer and a remainder of the end effector.

2. The end effector of claim 1, wherein the plurality of wafer-contacting surfaces includes at least three wafer-contacting surfaces, wherein each of the plurality of wafer-contacting surfaces is a common distance from a central point, and further wherein the plurality of wafer-contacting surfaces is radially distributed about the central point.

3. The end effector of claim 2, wherein each of the plurality of wafer-contacting surfaces defines a radial extent of at least 0.5 mm as measured in a radial direction from the central point.

4. The end effector of claim 1, wherein each of the plurality of wafer-contacting surfaces defines a wafer-contacting surface area of at least 0.25 square millimeters.

5. The end effector of claim 1, wherein each of the plurality of wafer-contacting surfaces is at least substantially rigid.

6. The end effector of claim 1, wherein each of the plurality of wafer-contacting surfaces is an at least substantially planar wafer-contacting surface.

7. The end effector of claim 1, wherein each of the plurality of wafer-contacting surfaces is defined by the end effector body.

8. The end effector of claim 1, wherein the plurality of wafer-contacting surfaces defines a wafer contact plane.

9. The end effector of claim 1, wherein each of the plurality of wafer-contacting surfaces is coplanar with a remainder of the plurality of wafer-contacting surfaces to within a threshold tolerance of less than 200 micrometers.

10. The end effector of claim 1, wherein each of the plurality of wafer-contacting surfaces is at least substantially fixed relative to a remainder of the plurality of wafer-contacting surfaces.

11. The end effector of claim 1, wherein each of the plurality of sealing structures extends around the respective one of the plurality of wafer-contacting surfaces.

12. The end effector of claim 1, wherein each of the plurality of sealing structures is configured to form the vacuum seal based upon a pressure differential across the sealing structure.

13. The end effector of claim 1, wherein the plurality of sealing structures includes a plurality of O-rings.

14. The end effector of claim 1, wherein the plurality of sealing structures includes a plurality of compliant gaskets.

15. The end effector of claim 1, wherein each sealing structure of the plurality of sealing structures is formed from at least one of a silicone and a polyimide.

16. The end effector of claim 1, wherein each of the plurality of sealing structures includes an O-ring, and further wherein the groove is oversized relative to the O-ring to permit limited translation of the O-ring in a direction that is normal to a respective wafer-contacting surface that is defined by the contact projection.

17. The end effector of claim 1, wherein each of the plurality of sealing structures includes a compliant gasket, wherein the groove is sized to retain the compliant gasket, wherein the compliant gasket includes a central opening, wherein the contact projection extends within the central opening, and further wherein the central opening and the groove are sized such that the compliant gasket has a convex configuration relative to the end effector body.

18. The end effector of claim 17, wherein the end effector further includes an orientation regulating structure located to contact the compliant gasket and to urge an outer edge of the compliant gasket away from an upper surface of the end effector body.

19. A semiconductor manufacturing device, comprising:

a transfer robot;

an end effector, wherein the end effector includes the end effector of claim 1; and a vacuum source, wherein the vacuum source is configured to apply a vacuum to the vacuum distribution manifold.

20. The device of claim 19, wherein the semiconductor manufacturing device includes at least one of a test system, a probe system, an engineering system, a high volume manufacturing system, and a wafer processing system.

21. The end effector of claim 1, wherein each of the plurality of sealing structures includes a compliant gasket, wherein the groove is sized to retain the compliant gasket, wherein the compliant gasket includes a central opening, wherein the contact projection extends within the central opening, and further wherein the groove is oversized relative to the central opening such that the compliant gasket has a convex configuration relative to the end effector body.

22. The end effector of claim 1, wherein each of the plurality of sealing structures includes a compliant gasket, wherein the groove is sized to retain the compliant gasket, wherein the compliant gasket includes a central opening, wherein the contact projection extends within the central opening, and further wherein an outer edge of the compliant gasket extends away from the end effector body farther than the wafer contacting surface extends from the end effector body.

* * * * *